(12) United States Patent
Durkin et al.

(10) Patent No.: US 8,605,762 B2
(45) Date of Patent: Dec. 10, 2013

(54) LASER APPARATUS

(75) Inventors: Michael Kevan Durkin, Southampton (GB); Malcolm Paul Varnham, Alresford (GB); Mikhail Nickolaos Zervas, Southampton (GB)

(73) Assignee: SPL Lasers UK Limited, Southampton (GB)

( * ) Notice: Subject to any disclaimer, the term of this patent is extended or adjusted under 35 U.S.C. 154(b) by 10 days.

(21) Appl. No.: 13/261,394

(22) PCT Filed: Feb. 10, 2011

(86) PCT No.: PCT/GB2011/000180
§ 371 (c)(1),
(2), (4) Date: Aug. 8, 2012

(87) PCT Pub. No.: WO2011/101614
PCT Pub. Date: Aug. 25, 2011

(65) Prior Publication Data
US 2012/0300797 A1 Nov. 29, 2012

(30) Foreign Application Priority Data
Feb. 17, 2010 (GB) .................................. 1002740.7

(51) Int. Cl.
*H01S 3/13* (2006.01)
(52) U.S. Cl.
USPC ............ 372/32; 372/6; 359/341.1; 359/341.2
(58) Field of Classification Search
USPC ............................ 372/6, 32; 359/341.1–341.5
See application file for complete search history.

(56) References Cited

U.S. PATENT DOCUMENTS

| | | | |
|---|---|---|---|
| 5,930,030 A | 7/1999 | Scifres | |
| 6,157,755 A | 12/2000 | Brauch et al. | |
| 2008/0165413 A1* | 7/2008 | Tamaoki | 359/341.3 |
| 2011/0142084 A1* | 6/2011 | Reid et al. | 372/20 |

OTHER PUBLICATIONS

Written Opinion from the International Searching Authority for International Application No. PCT/GB2011/000180, dated Jun. 16, 2011, 7 pages (unnumbered).

(Continued)

*Primary Examiner* — Tod T Van Roy
(74) *Attorney, Agent, or Firm* — Iandiorio Teska & Coleman, LLP (57) ABSTRACT

Laser apparatus (1) comprising a reference source (2), a reference fiber (3), and at least one laser diode (4), wherein the reference fiber (3) comprises a core (5) having a refractive index $n_1$ and a first cladding (6) having a refractive index $n_2$, the first cladding (6) is surrounded by a second cladding (7) having a refractive index $n_3$, the refractive index $n_1$ is greater than the refractive index $n_2$, the refractive index $n_2$ is greater than the refractive index $n_3$, the laser diode (4) emits laser radiation (8) that is guided through the first cladding (6) of the reference fiber (3), the reference source (2) emits reference radiation (9) that has a predetermined wavelength $\lambda_R$ (10), the reference radiation (9) is guided through the core (5) of the reference fiber (3) to the laser diode (4), and the reference radiation (9) that is guided through the core (5) of the reference fiber (3) to the laser diode (4) has a power (11) at the predetermined wavelength $\lambda_R$ (10), which power is greater than an injection locking threshold of the laser diode.

15 Claims, 4 Drawing Sheets

(56) References Cited

OTHER PUBLICATIONS

Goldberg et al., Injection Locking and Single-Mode Fiber Coupling of a 40-Element Laser Diode Array, Applied Physics Letters, AIP, American Institute of Physics, vol. 50, No. 24, Jun. 15, 1987, pp. 1713-1715.

Duling et al., "High-Power, Mode-Locked ND: Fibre Laser Pumped by an Injection-Locked Diode Array", Electronics Letters, Oct. 13, 1988, vol. 24, No. 21, pp. 1333-1335.

\* cited by examiner

LASER APPARATUS

FIELD OF INVENTION

This invention relates to laser apparatus. The invention can improve the efficiency of cladding pumped fibre lasers, thereby enabling them to consume less energy, which is better for the environment.

BACKGROUND TO THE INVENTION

Fibre lasers are finding wide commercial application in many industrial processes such as marking, cutting, welding and brazing. Diode-pumped fibre lasers have become commercially available that can emit 10 W to 2 kW of laser radiation in a near diffraction limited beam. These lasers are based on rare-earth doped optical fibres which emit in the fundamental mode. The optical fibres are typically based on large mode area fibres such as those described in U.S. Pat. No. 6,614,975. The large mode area enables output power levels to be increased to levels which would cause optical damage to optics and optical fibres within the laser if conventional singlemode fibres were used, and which would result in non-linear effects such as stimulated Raman scattering and stimulated Brillouin scattering if a truly single-mode core were used.

Further increases in output power can be achieved by relaxing the requirement that the fibre laser emits a near diffraction limited beam. A few-moded fibre laser (beam quality $M^2$ in the range 2 to approximately 20) can be designed by increasing the core diameter. This enables the output power to be increased, whilst maintaining beam qualities that are better than competing technologies. Further increase in power can be achieved by combining the single-mode or few-moded laser radiation from several rare-earth doped fibres together. Rare-earth doped fibre lasers are commercially available that can emit up to 1 kW to 50 kW of laser radiation with excellent beam quality.

Fibre lasers typically use cladding-pumping in which pump light is coupled into the inner cladding of an optical fibre that comprises a rare-earth doped core, an inner cladding, and an outer cladding. The pump radiation is guided along the inner cladding and is gradually absorbed by the core. Cladding pumping has a major advantage in that pump light can be supplied by low-cost, high-power, multi-mode laser diodes. A disadvantage is that the length of fibre required to absorb the pump radiation is longer than a core-pumped fibre laser by a factor approximately equal to the ratio of the area of the inner cladding to the area of the core. This increase in length is undesirable because it reduces the efficiency of a fibre laser or amplifier, and increases undesirable optical non-linear effects.

It is generally desirable for an amplified optical signal to have high beam quality and high peak powers for optimum materials processing capability. In an optical fibre, high beam quality places certain limitations on the dimensions of the core in order to maintain single-moded or few-moded propagation. These restrictions in core size lead to high optical intensities within the core during the amplification of high-power optical radiation. High optical intensities lead to undesirable optical non-linearities which need to be mitigated by short fibre lengths to minimise the interaction length. For example, pulsed fibre lasers having average powers of 10 W to 50 W typically have peak powers in excess of 5 kW. Reducing the fibre length is important to avoid stimulated Brillouin scattering and stimulated Raman scattering. The first can lead to undesirable pulsing and catastrophic failures owing to the associated acoustic phonon shattering the core of the fibre. The latter can lead to undesirable wavelength shifts. Similar non-linear effects are also seen in high-power continuous-wave lasers where power levels in excess of 100 W can lead to wavelength shifts induced by stimulated Raman scattering. The problem is clearly even more important between approximately 400 W to 2 kW in single mode lasers, and between approximately 4 kW to 50 kW in few-moded or multi-moded lasers.

In order to minimise the length of the optical fibre, and thereby minimize losses and non-linear effects, it is preferable to use a pump radiation wavelength that is well-matched to the strongest absorption peak of the active dopant in the core. A commonly-used rare-earth dopant is ytterbium, which has an absorption peak at 976±3 nm. This absorption peak has approximately two to three times the absorption per unit length than the absorption between 910 and 970 nm. However, multi-mode pump laser diodes have poor wavelength repeatability from device-to-device (typically ±10 nm), a strongly temperature-dependent wavelength (typically 0.3 nm/K), and a strong dependence of wavelength on output power (typically 1 nm/W). Over a typical operating temperature range for an industrial laser (0 to 60 C), the wavelength emitted by the pump diodes may vary by as much as 30 nm. Even if the laser diode is temperature stabilised, the power-dependence of wavelength (10 nm for a 10 W emitter) makes it difficult to directly-pump the strongest absorption peak of ytterbium, especially in pulsed applications in which the pump diodes are switched on and off repeatedly. Switching the pump diodes on and off repeatedly leads to pump wavelength variation while the pump diodes thermally stabilise each time they are turned on, and pump wavelength variation as the average temperature of the pump diodes thermally stabilises. Similar limitations occur with other rare earth dopants, and for fibres containing two or more rare-earth dopants, for example, erbium ytterbium fibres which are optimally pumped at 976 nm and which emit at around 1550 nm to 1560 nm. The difficulty in directly pumping the strongest absorption peak of rare earth dopants, cheaply and reliably, provides a limitation to the peak power capability of low-cost rare-earth-doped fibre lasers and amplifiers, and in particular pulsed rare-earth doped fibre lasers and amplifiers. It is for these reasons that the vast majority of high power ytterbium doped fibre lasers and amplifiers use multimode laser diodes emitting pump radiation within a wavelength range of 910 nm to 950 nm at which the absorption of ytterbium is approximately two to three times smaller than at 976 nm.

Recent approaches to stabilizing the pump wavelength include using volume Bragg gratings to provide feedback to the multi-mode laser diodes in order to provide some degree of wavelength-locking. Volume Bragg gratings are expensive, and are typically used on high-current laser diode bars as opposed to the single emitter laser diodes commonly used in fibre lasers. The wavelength locking performance over typical temperature and operating power ranges is also questionable.

There is therefore a need for a laser apparatus in which the laser radiation can be matched to the peak absorption of an active medium. An associated need which is important for environmental (ie green) considerations is to improve the efficiency of lasers and amplifiers. A further need is to allow the increase of optical power from fibre lasers and amplifiers without incurring undesirable non-linear effects.

An aim of the present invention is to provide laser apparatus which reduces the above aforementioned problems.

The Invention:

According to a non-limiting embodiment of the invention, there is provided laser apparatus comprising a reference source, a reference fibre, and at least one laser diode, wherein the reference fibre comprises a core having a refractive index $n_1$ and a first cladding having a refractive index $n_2$, the first cladding is surrounded by a second cladding having a refractive index $n_3$, the refractive index $n_1$ is greater than the refractive index $n_2$, the refractive index $n_2$ is greater than the refractive index $n_3$, the laser diode emits laser radiation that is guided through the first cladding of the reference fibre, the reference source emits reference radiation that has a predetermined wavelength, the reference radiation is guided through the core of the reference fibre to the laser diode, and the reference radiation that is guided through the core of the reference fibre to the laser diode has a power at the predetermined wavelength, which power is greater than an injection locking threshold of the laser diode thereby to injection lock the laser diode.

Injection locking is a process whereby the output frequency of a first oscillator is controlled by coupling radiation from a second, usually more stable oscillator into the first oscillator. In general, laser diodes have poorly defined wavelengths, that are temperature dependent, and which vary as the laser diode is switched on. By coupling the reference radiation from the reference source into the laser diode, it is possible to injection lock the laser diode such that its output wavelength is forced to become substantially equal to the wavelength of the reference radiation. This enables the wavelength of the laser diode to be determined by selecting a reference source that emits at the predetermined wavelength. It also enables the wavelength of the laser diode to be stabilized as it establishes thermal equilibrium shortly after it is turned on.

The predetermined wavelength is a wavelength that is preselected by a user. The predetermined wavelength may be the wavelength at which an amplifier or a laser can be pumped by the laser diode at maximum efficiency, lowest noise, maximum power, shortest length, lowest non-linear phase, or another parameter that has importance to the user.

Advantageously, the invention provides a means to injection lock the laser diode, and in particular a multimode laser diode, rapidly, and simply, and to do this while providing high levels of output powers (greater than 60% of the power emitted by the laser diode, preferably greater than approximately 90%, and more preferably greater than 95%) at a laser output with a wide selection of injection locked wavelengths that are defined by the choice of the predetermined wavelength of the reference source. Suitable predetermined wavelengths include: the peak absorption wavelength of a rare-earth doped fibre laser, rod laser, or disk laser; a wavelength at which heat dissipation is reduced or preferably minimized in a fibre laser, rod laser, or disk laser; and a wavelength which optimizes efficiency within a fibre laser, rod laser, or disk laser. These features are consistent with achieving a fast modulation rate of wavelength-locked pump radiation in fibre lasers, rod lasers and disk lasers, which is necessary for rapid process control in marking, cutting, welding and brazing applications. Moreover, it allows such fast modulation rates to be achieved with increased efficiencies, reduced amplifier fibre lengths, which combination leads to lower non-linear effects (such as self phase modulation) and/or higher peak powers being available from amplifiers and lasers. The invention solves the problem of poor wavelength control and repeatability of multimode laser pump diodes, namely poor wavelength repeatability from device to device±10 nm, strong temperature dependent wavelength (0.3 nm/K), and strong power-dependence on wavelength (1 nm/W). The invention permits amplified optical signals to have high beam quality and high peak powers for optimum materials processing capability without necessitating the high optical intensities within the core during the amplification of high-power optical radiation. It permits shorter fibre lengths to be used to avoid undesirable optical non-linearities. It is particularly useful for reducing pulse distortion owing to self phase modulation and stimulated Brillouin scattering in pulsed fibre lasers having average powers of 10 W to 50 W and peak powers in excess of 5 kW. It is also useful for reducing non-linear effects such as stimulated Raman scattering in high-power single moded or few moded (beam quality $M^2$ in the range 2 to approximately 20) continuous-wave lasers having power levels in excess of 100 W, 400 W, 1 kW or more preferably, in excess of 4 kW.

The reference source can be a semiconductor laser having an external cavity or which is stabilized by an etalon or grating. The reference source can also be a different type of laser such as a gas laser or a solid state laser.

The reference source may be such that the product of its power at the predetermined wavelength and a first loss experienced by the reference radiation in propagating from the reference source to the laser diode is at least 0.5% of the power of the laser radiation emitted by the laser diode. This is to ensure that there is sufficient of the reference radiation incident on the laser diode to injection lock it reliably and repeatedly. Preferably the laser apparatus is designed to minimize the first loss in order to maximise the reference radiation received by the laser diode.

The laser apparatus may be one in which a second loss experienced by the laser radiation in propagating from the laser diode to the reference source is such that the product of the second loss and the power emitted by the laser diode is less than 10% of the power emitted by the reference source. This is to ensure that the laser radiation does not damage the reference source. Preferably the laser apparatus is designed to increase or maximise the second loss in order to minimize the laser radiation received by the reference source.

The laser apparatus may include a coupler for coupling the reference radiation from the core to the first cladding of the reference fibre. The coupler may be a blazed fibre Bragg grating.

The laser apparatus may include a wavelength division multiplexer.

The laser apparatus may include an amplifying means. The amplifying means can be an amplifying fibre.

The reference fibre and the amplifying fibre may be in optical contact along a portion of their length such that the laser radiation guided by the first cladding of the reference fibre can couple into and pump the amplifying fibre.

The amplifying fibre may comprise a pedestal.

The amplifying fibre may comprise at least one rare-earth dopant.

The laser diode may be arranged to counterpump the amplifying fibre.

The reference fibre may be a single mode fibre.

The laser diode may be a multimode laser diode. The multimode laser diode may be a single emitter laser diode, a diode bar, or a diode stack.

The laser apparatus may comprise a plurality of the laser diodes, wherein the laser diodes are combined by a combiner.

BRIEF DESCRIPTION OF THE DRAWINGS

Embodiments of the invention will now be described solely by way of example and with reference to the accompanying drawings in which.

DETAILED DESCRIPTION OF PREFERRED EMBODIMENTS OF THE INVENTION

Figure 1:
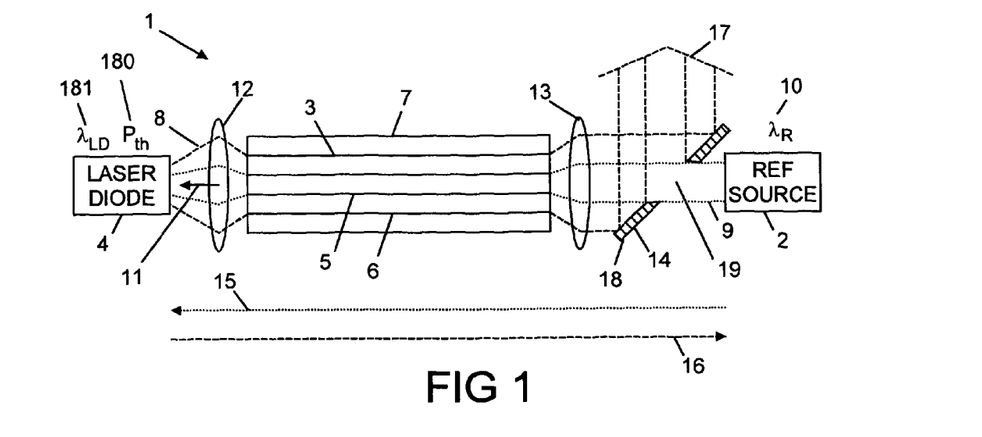
FIG. 1 shows laser apparatus according to the present invention.

With reference to FIG. 1, there is shown laser apparatus 1 comprising a reference source 2, a reference fibre 3, and at least one laser diode 4, wherein the reference fibre 3 comprises a core 5 having a refractive index $n_1$ and a first cladding 6 having a refractive index $n_2$, the first cladding 6 is surrounded by a second cladding 7 having a refractive index $n_3$. The refractive index $n_1$ is greater than the refractive index $n_2$, and the refractive index $n_2$ is greater than the refractive index $n_3$. The laser diode 4 emits laser radiation 8 that is guided through the first cladding 6 of the reference fibre 3. The reference source 2 emits reference radiation 9 that has a predetermined wavelength $\lambda_R$ 10. The reference radiation 9 is guided through the core 5 of the reference fibre 3 to the laser diode 4. The reference radiation 9 that is guided through the core 5 of the reference fibre 3 to the laser diode 4 has a power 11 at the predetermined wavelength $\lambda_R$ 10, which power 11 is greater than an injection locking threshold $P_{th}$ 180 of the laser diode 4.

Arranging the power 11 to be greater than the injection locking threshold $P_{th}$ 180 ensures that the laser diode 4 is injection locked to the reference source 2. Injection locking forces the laser diode wavelength $\lambda_{LD}$ 181 to become substantially equal to the predetermined wavelength $\lambda_R$ 10. The optimum amount of power 11 for a particular application can be determined by experimentation. In general, the higher the power 11 is above the injection locking threshold $P_{th}$ 180, the faster the laser diode 4 will injection lock. It is preferred that the reference radiation 9 is being received by the laser diode 4 before or as the laser diode 4 is switched on as this can have the effect of reducing the injection locking threshold $P_{th}$ 180, and reducing the time taken for the laser diode 4 to become injection locked.

The laser radiation 8 and the reference radiation 9 are shown being coupled into the reference fibre 3 by first and second lenses 12 and 13.

The reference source 2 and the laser diode 4 are capable of lasing independently of each other. In order to injection lock the laser diode 4, it is preferable that the power 11 received by the laser diode 4 is at least 0.5% of the power of the laser radiation 8 emitted by the laser diode 4. The reference radiation 9 experiences a first loss 15 in propagating from the reference source 2 to the laser diode 4. The reference source 2 is such that the product of the first loss 15 and the power emitted by the reference source 2 at the predetermined wavelength $\lambda_R$ 10 should be at least 0.5% of the power of the laser radiation 8 emitted by the laser diode 4. In many laser diodes 4, it is preferable that the reference source 2 is such that the product is at least 1%. In certain laser diodes 4, it is more preferable that the reference source 2 is such that the product is at least 5%. These values ensure that there is sufficient of the reference radiation 9 incident on the laser diode 4 to injection lock it reliably and repeatedly. Preferably the laser apparatus 1 is designed to minimize the first loss 15 in order to maximise the reference radiation 9 received by the laser diode 4.

A second loss 16 can be defined as the loss experienced by the laser radiation 8 in propagating from the laser diode 4 to the reference source 2. The laser apparatus 1 can be such that the product of the second loss 16 and the power of the laser radiation 8 emitted by the laser diode 4 is at most 10% of the power of the reference radiation 9 emitted by the reference source 2. Preferably, the laser apparatus 1 is such that the product is at most 5%, and more preferably, at most 1%. These values ensure that the laser radiation 8 does not damage the reference source 2. Preferably the laser apparatus 1 is designed to increase or maximise the second loss 16 in order to minimize the laser radiation 8 received by the reference source 2.

A laser output 17 is provided by separating the laser radiation 8 from the reference radiation 9 with a separating means 14. The separating means 14 helps to prevent the laser radiation 8 from damaging the reference source 2. The separating means 14 can comprise at least one of a coupler, a reflector, a grating, a spatial filter, an optical switch, an optical modulator, an acousto-optic modulator, an isolator, and an absorber. Preferably the separating means 14 is such that the power of the laser output 17 is at least 60% of the power of the laser radiation 8 emitted by the laser diode 4. More preferably, the separating means 14 is such that the power of the laser output 17 is at least 90%, or at least 95% of the power of the laser radiation 8. This is advantageous because it enables most of the laser radiation 8 to be available for pumping amplifiers and lasers.

The separating means 14 depicted in FIG. 1 is a spatial filter 18 comprising an aperture 19 through which the reference radiation 9 can pass. The spatial filter 18 is such that it reflects the laser radiation 8 that does not pass through the aperture 19. A large aperture 19 increases the amounts of the laser radiation 8 and the reference radiation 9 that will pass through, and decreases the amount of the laser radiation 8 in the laser output 17. It is desirable to reduce the size of the aperture 19 to increase the amount of laser radiation 8 in the laser output 17 commensurate with allowing sufficient of the reference radiation 9 to pass through the aperture 19 in order to injection lock the laser diode 4.

Figure 2:
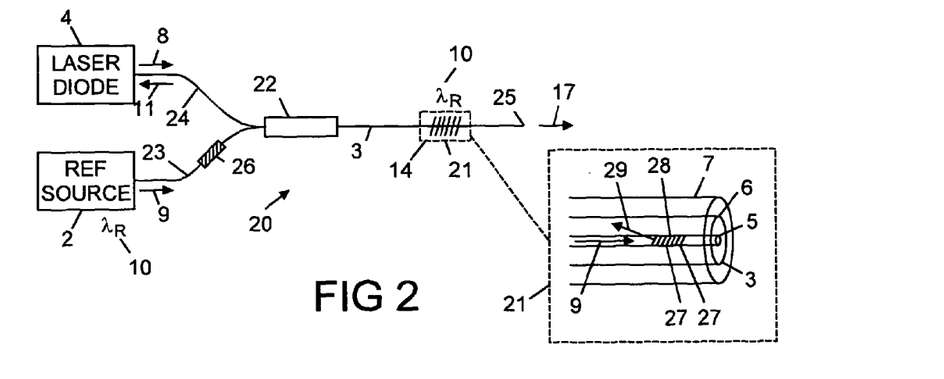
FIG. 2 shows laser apparatus including a coupler.

FIG. 2 shows a laser apparatus 20 in which the separating means 14 is a coupler 21 that couples the reference radiation 9 from the core 5 of the reference fibre 3 to the first cladding 6 of the reference fibre 3. The coupler 21 can be a blazed fibre Bragg grating 28 that couples forward going waves propagating in the core 5 into backward travelling waves that propagate in the first cladding 6. The blazed fibre Bragg grating 28 can be considered to be a reflector that reflects the reference radiation 9 that propagates along the core 5 into reference radiation 29 that propagates in the first cladding 6. As shown in the indent of FIG. 2, the blazed fibre Bragg grating 28 can comprise individual grating lines 27 that are in or near to the core 5 of the optical fibre 3. The blazed fibre Bragg grating 28 can be designed to reflect the reference radiation 9 having the predetermined wavelength $\lambda_R$ 10. Blazed fibre Bragg gratings can be manufactured by placing a photosensitive fibre at an angle into the interference pattern obtained using ultra violet light.

FIG. 2 also shows a coupler 22 for combining the laser radiation 8 from the laser diode 4 and the reference radiation 9 from the reference source 2. Laser radiation 8 is shown being guided to the coupler 22 from the laser diode 4 via an optical fibre 24. The optical fibre 24 is preferably a multimode fibre, which may be a pure silica core fibre with low refractive index coating. Such fibres are commonly used to guide pump radiation in fibre lasers and solid state lasers. The reference fibre 3 can extend from the coupler 21 through the coupler 22 to the reference source 2. More conveniently, the reference fibre 3 terminates within or near to the coupler 22, and the reference radiation 9 is guided to the coupler 22 via an optical fibre 23 which may be a singlemode or a multimode fibre. A cladding mode stripper 26 can be provided for removing laser radiation 8 that may be propagating in the cladding of the optical fibre 23. Alternatively, or additionally, the optical fibre 23 can be a standard singlemode or multimode optical fibre having a high refractive index coating for removing cladding modes. Removing laser radiation 8 that may be propagating in the cladding of the optical fibre 23 is beneficial as it increases the second loss 16 (shown with reference to FIG. 1), thereby reducing the risk that the laser diode 4 will damage or destabilize the reference source 2. The coupler 22 can be a power combiner. Power combiners that combine the radiation from 3, 7 or 19 fibres are sold by OFS Specialty Photonics Division of Furukawa Electric North America Inc. of Somerset, N.J., USA for use in fibre lasers and optical amplifiers. Such power combiners can have a single-mode waveguide as one of the input fibres (for example, fibre 23), and a single double clad fibre that contains a single-mode waveguide as the output fibre (for example, reference fibre 3). Such power combiners can be used to combine the laser radiation 8 from between 1 and 18 laser diodes 4, or preferably 2, 6 or 18 laser diodes 4 with the reference radiation 9 from the reference source 2. The distal end 25 of the reference fibre 3 provides the laser output 17. The distal end 25 can be angle cleaved to reduce back reflected light, or connected or fusion spliced to another optical fibre.

Figure 3:
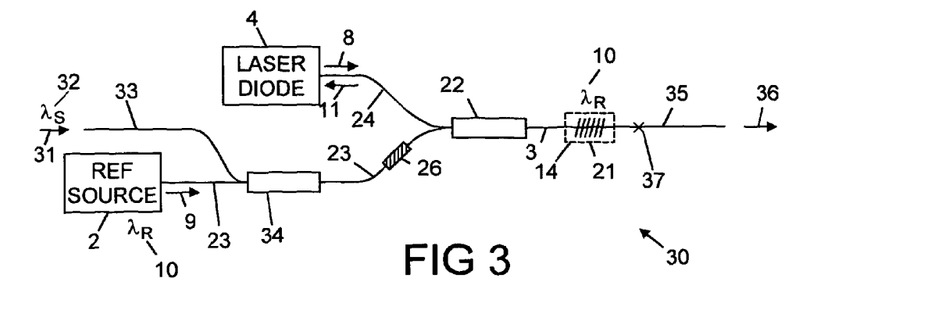
FIG. 3 shows laser apparatus including a wavelength division multiplexer.

FIG. 3 shows a laser apparatus 30 which includes a wavelength division multiplexer 34. The wavelength division multiplexer 34 is used for combining the reference radiation 9 and a signal 31 having a wavelength $\lambda_s$ 32. The signal 31 is input to the wavelength division multiplexer 34 via optical fibre 33. The signal 31 and the reference radiation 9 are combined with the laser radiation 8 in the coupler 22. The coupler 21 is such that it couples the reference radiation 9 from the core 5 of the reference fibre 3 to the first cladding 6 of the reference fibre 3 from where it is guided to the laser diode 4. The coupler 21 passes the signal 31 and the laser radiation 8 to an amplifying fibre 35. The amplifying fibre 35 is pumped by the laser radiation 8, amplifies the signal 31, and emits an amplified signal 36. The amplifying fibre 35 is shown fusion spliced to the reference fibre 3 at splice 37.

Figure 4:
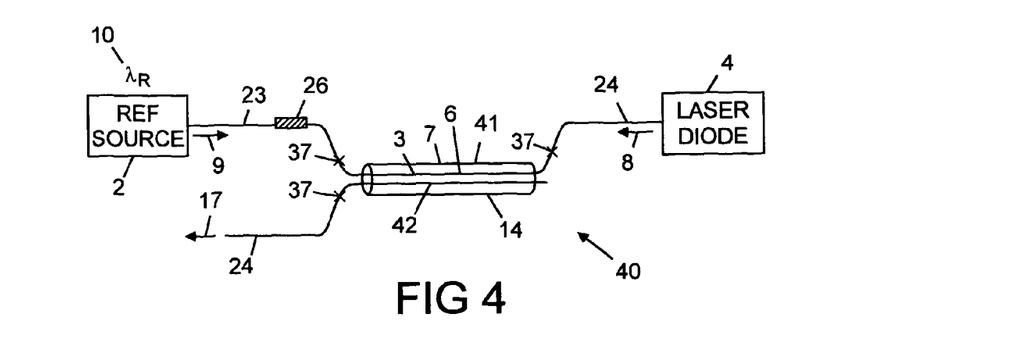
FIG. 4 shows laser apparatus including a composite fibre that separates laser radiation from reference radiation.
Figure 5:
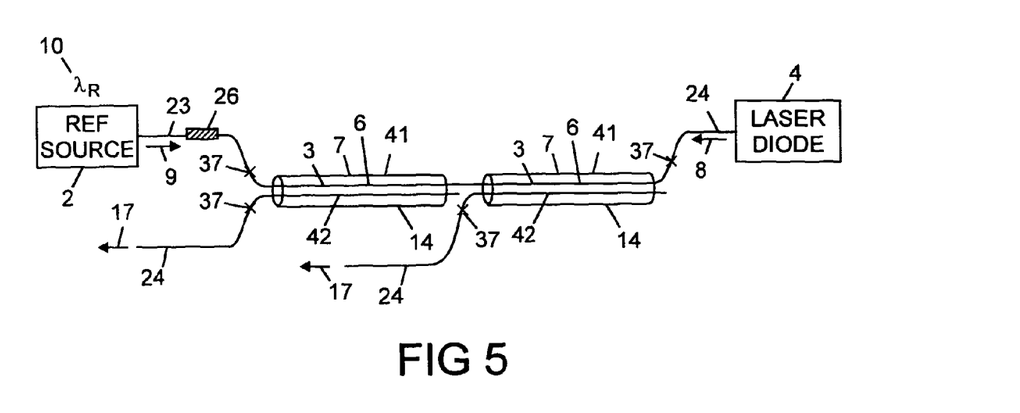
FIG. 5 shows laser apparatus including two of the composite fibres.

FIG. 4 shows a laser apparatus 40 in which the separating means 14 is a composite fibre 41 comprising the reference fibre 3 and a second fibre 42 that are in optical contact with each other along at least a portion of their length. By optical contact, it is meant that the laser radiation 8 that is guided by the first cladding 6 of the reference fibre 3 can couple into the second fibre 42. The reference fibre 3 and the second fibre 42 share the same second cladding 7 which may be a low refractive index polymer. Reference radiation 9 is guided along the core 5 of the reference fibre 3 to the laser diode 4, thereby injection locking the laser diode 4. Laser radiation 8 is guided along the first cladding 6 of the reference fibre 3, and coupled into the second fibre 42. The laser radiation 8 is then guided along the second fibre 42 to form the laser output 17. The proportion of the laser radiation 8 that is coupled across to the second fibre 42 will be approximately equal to the ratio of the cross-sectional area of the second fibre 42 to the sum of the cross-sectional areas of the second fibre 42 and the reference fibre 3. Thus if the second fibre 42 has the same cross-sectional area as the reference fibre 3, then approximately half the laser radiation 8 would couple across. To prevent this laser radiation 8 from reaching the reference source 2, it would therefore be desirable to absorb the laser radiation 8 that is not coupled across within the coating of the fibre 23, or more preferably, to remove the laser radiation 8 with the cladding mode stripper 26. In order to couple a higher proportion of the laser radiation 8 from the reference fibre 3 to the second fibre 42, it is desirable to make the cross-sectional area of the second fibre 42 larger than the cross-sectional area of the reference fibre 3. However, this reduces the brightness of the laser radiation 8 that propagates in the second fibre 42. Alternatively, or additionally, two or more separating means 14 can be used as shown in FIG. 5, whose relative lengths can be adjusted in order to adjust the relative laser radiation 17 emitted from each.

Figure 6:
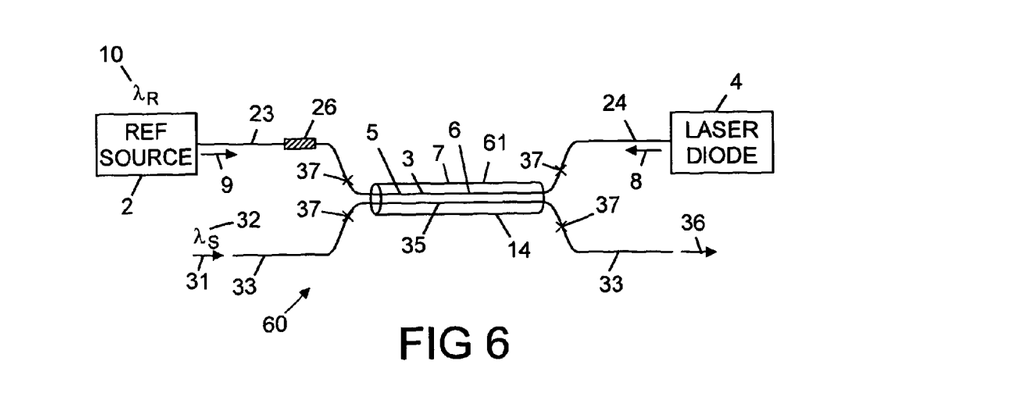
FIG. 6 shows laser apparatus including a composite fibre which comprises an amplifying fibre in optical contact with a reference fibre.

FIG. 6 shows a laser apparatus 60 in which the separating means 14 is a composite fibre 61. The composite fibre 61 comprises the reference fibre 3 and the amplifying fibre 35 in optical contact with each other. The amplifying fibre 35 and the reference fibre 3 share the second cladding 7, which can be a polymer coating that is preferably applied when drawing the composite fibre 61 during manufacture. Laser radiation 8 that is coupled across to the amplifying fibre 35 can be used to pump the amplifying fibre 35. Absorption of the laser radiation 8 by the amplifying fibre 35 reduces the amount of the laser radiation 8 that is propagating along the composite fibre 61. By selecting the length of the composite fibre 61 (eg by calculation or by cut back experiments), it is possible to absorb at least 90% of the laser radiation 8, and preferably at least 95%. Any remaining laser radiation 8 in the reference fibre 3 is preferably absorbed or scattered by the cladding mode stripper 26. Alternatively or additionally, the remaining laser radiation 8 can be absorbed or scattered by a cladding, such as high refractive index polymer coating, in the fibre 23.

Apparatus and methods of manufacturing the composite fibres 41 and 61 are described in U.S. Pat. No. 6,826,335, which patent is hereby incorporated by reference herein.

Figure 7:
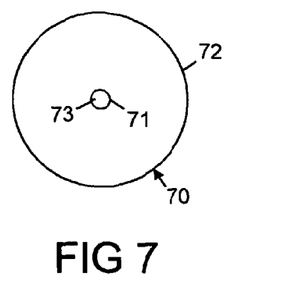
FIG. 7 shows a cross section of an amplifying fibre.

The amplifying fibre 35 can be the amplifying fibre 70 depicted in FIG. 7. The amplifying fibre 70 comprises a core 71, at least one cladding 72, and at least one rare-earth dopant 73. The core 71 can be centrally located in the cladding 72, or offset. The cladding 72 can be circular or non-circular. The rare earth dopant 73 is shown as being within the core 71. Alternatively or additionally, the rare earth dopant 73 can be located in the cladding 72. The rare earth dopant 73 can be selected from the group comprising ytterbium, erbium, neodymium, praseodymium, thulium, samarium, holmium, terbium and dysprosium. The amplifying fibre 70 is preferably coated with a polymer coating such as the second cladding 7 shown with reference to FIG. 6. The refractive index of the core 71 is higher than the refractive index of the cladding 72, and the refractive index of the cladding 72 is higher than the refractive index of the polymer coating. The purpose of the cladding 72 is to guide the laser radiation 8 such that the laser radiation 8 is absorbed by the rare-earth dopant 73. The amplifying fibre 70 can be used in conjunction with the apparatus shown in FIGS. 1 to 6. The amplifying fibre 70 can be co-pumped or counter-pumped.

Figure 8:
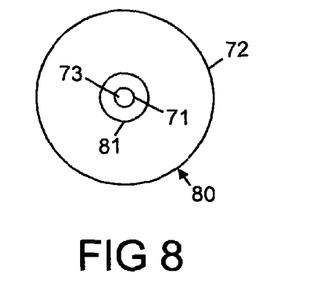
FIG. 8 shows a cross section of an amplifying fibre that includes a pedestal.

The amplifying fibre 35 can be the amplifying fibre 80 as shown with reference to FIG. 8. The amplifying fibre 80 can include a pedestal 81. The pedestal surrounds the core 71, and has a refractive index that is lower than the refractive index of the core 71, but higher than the refractive index of the cladding 72. The purpose of the pedestal 81 is to guide optical radiation that escapes the core 71, for example as a result of bends or back reflections, and thereby reduce the amount of radiation that can propagate to the laser diode 4 or to the reference source 2.

The amplifying fibre 35 can have a solid core 71 and a solid cladding 72 (as shown with reference to FIGS. 7 and 8) or be a so-called holey fibre having a core defined by longitudinally extending holes in the cladding 72. The amplifying fibre 35 can be a single mode fibre, a large mode area fibre, or a multimode fibre. Alternatively or additionally, the amplifying fibre 35 can be a polarization maintaining fibre.

Figure 9:
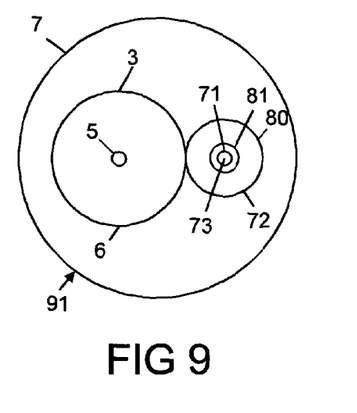
FIG. 9 shows a cross section of a composite fibre that includes a reference fibre and an amplifying fibre surrounded by a common cladding.

The composite fibre 61 can be the composite fibre 91 shown with reference to FIG. 9. The composite fibre 91 comprises the reference fibre 3 and the amplifying fibre 80 surrounded by the second cladding 7.

Figure 10:
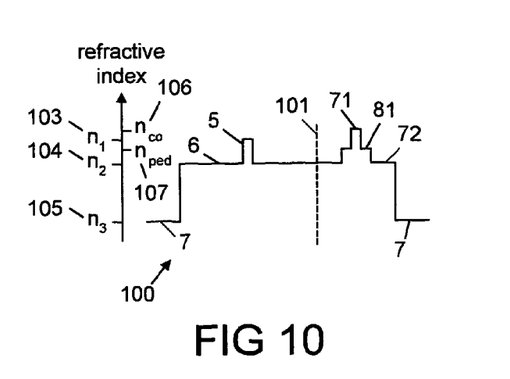
FIG. 10 shows a refractive index profile of the composite fibre.

FIG. 10 shows the refractive index profile 100 of the composite fibre 91 across the horizontal axis of the cross section shown in FIG. 9. The reference fibre 3 and the amplifying fibre 80 are shown as touching by the dashed line 101. The core 5 has refractive index $n_1$ 103, the first cladding 6 has refractive index $n_2$ 104, and the second cladding 7 has refractive index $n_3$ 105. It is assumed in the figure that the refractive index of the cladding 72 of the amplifying fibre 80 is substantially the same as the refractive index of the first cladding 6 of the referenced fibre 3. This is preferred to assist in the transfer of the laser radiation 8 from the reference fibre 3 to the amplifying fibre 80. The pedestal 81 has refractive index $n_{ped}$ 107 which is greater than the refractive index of the cladding 72. The core 71 has refractive index $n_{co}$ 106 which is greater than the refractive index $n_{ped}$ 107 of the pedestal 81. The diameter of the amplifying fibre 80 is preferably less than the diameter of the reference fibre 3 in order to maintain brightness of the laser radiation 8 as much as possible. Higher brightness allows for shorter amplifying fibres for the same absorption, which in turn leads to reduced non-linear effects such as self phase modulation, stimulated Brillouin scattering, and stimulated Raman scattering.

The laser diode 4 can be arranged to co-pump the amplifying fibre 35, as shown with reference to FIG. 3 where the laser radiation 8 propagates along the amplifying fibre 35 in the same direction as the signal 31 (left to right). Alternatively or additionally, the laser diode 4 can be arranged to counter-pump the amplifying fibre 35, as shown with reference to FIG. 6 where the laser radiation 8 propagates along the amplifying fibre 35 in the opposite direction to the signal 31.

Figure 11:
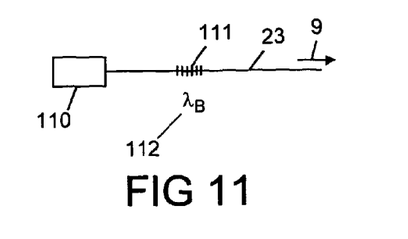
FIG. 11 shows a reference source comprising a laser diode and a reflector.

The reference source 2 shown in FIGS. 1 to 6 can be a semiconductor laser 110 as shown with reference to FIG. 11. The reference radiation 9 emitted by the semiconductor laser 110 can be stabilised by a reflector 111 as shown with reference to FIG. 11. The reflector 111 reflects light at the wavelength $\lambda_B$ 112, which is preferably equal to the predetermined wavelength $\lambda_R$ 10. The reflector 111 is preferably a fibre Bragg grating. Preferably, the reference source 2 emits the reference radiation 9 in a single transverse mode that is coupled to the fibre 23. The fibre 23 is preferably a single mode fibre. The reference fibre 3 is preferably a single mode fibre.

The reference source 2 can be two semiconductor lasers that are polarization multiplexed to provide a single output; this is useful for increasing the amount of the reference radiation 9 received by the laser diode 4, particularly if injection locking with only one of the semiconductor lasers is not achievable or is unreliable. Alternatively, or additionally, the reference source 2 can include an optical amplifier for amplifying the reference radiation 9. This is particularly useful when many laser diodes 4 need to be injection locked.

The reference source 2 can be a distributed feedback semiconductor laser, or a distributed feedback fibre laser. The reference source 2 can be a semiconductor laser having an external cavity or which is stabilized by an etelon or grating. The reference source 2 can also be a different type of laser such as a gas laser or a solid state laser.

Figure 12:
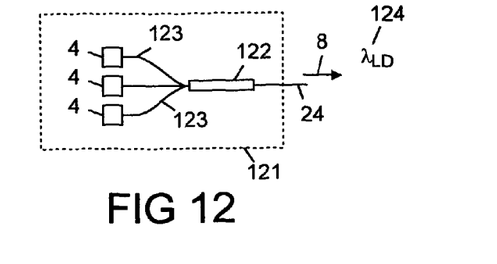
FIG. 12 shows a laser diode source comprising three laser diodes.

FIG. 12 shows a laser diode source 121 that comprises three laser diodes 4 whose outputs are combined together by a power combiner 122. The laser diodes 4 are preferably semiconductor laser diodes that emit multimode laser radiation 8 having a wavelength $\lambda_{LD}$ 124 into fibre 123. The multimode laser radiation 8 is combined together with a power combiner 122 and output via optical fibre 24. Power combiners that combine the radiation from 3, 7 or 19 fibres are sold by OFS Specialty Photonics Division of Furukawa Electric North America Inc. of Somerset, N.J., USA for use in fibre lasers and optical amplifiers. Alternatively, or additionally, the laser diode 4 can be a diode bar, or a diode stack.

Figure 13:
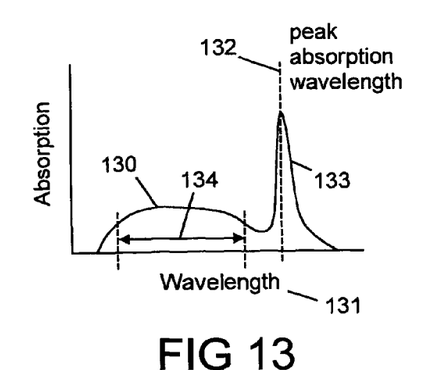
FIG. 13 shows an absorption spectrum of an amplifying fibre.

FIG. 13 shows the variation in absorption 130 with wavelength 131 for a typical amplifying fibre 70 that is doped with the rare earth dopant 73, shown with reference to FIG. 7. There is an absorption peak 133 that has a peak absorption wavelength 132. For ytterbium doped fibres, the peak absorption wavelength 132 is approximately 976 nm, and the absorption peak 133 is approximately 5 nm wide, and is significantly narrower than the broader absorption peak 134 at around 915 nm. By matching the predetermined wavelength $\lambda_R$ 10 to the absorption peak 133, it is possible to injection lock the laser diode 4 such that the laser radiation 8 emitted by the laser diode 4 has an output wavelength 124 that is matched to the absorption peak 133. This can be achieved in the apparatus shown in FIG. 11 by selecting a fibre Bragg grating having a reflection wavelength 112 equal to the peak absorption wavelength 132.

The predetermined wavelength $\lambda_R$ 10 may be selected to reduce thermal dissipation in the amplifying fibre 35. This can be achieved by reducing the wavelength separation between the predetermined wavelength $\lambda_R$ 10 and the signal wavelength $\lambda_s$ 32. For example, in ytterbium doped fibres, the predetermined wavelength $\lambda_R$ 10 can be selected to be 1030 nm and the signal wavelength $\lambda_s$ can be selected to be 1060 nm. Such a selection would result in less thermal dissipation in the amplifying fibre 35 than pumping at 976 nm. This can be achieved in the apparatus shown in FIG. 11 by selecting a fibre Bragg grating having a Bragg reflection wavelength $\lambda_B$ 112 equal to the predetermined wavelength $\lambda_R$ 10. The apparatus 110 can then be used as the reference source 2 in one of the apparatus shown with reference to FIGS. 1 to 6.

For apparatus in which the laser diode 4 is switched on and off, either once or repeatedly, the reference source 2 can be left on continuously to ensure that the reference radiation 9 is present each time the laser diode 4 is switched on. Alternatively, the reference source 2 can be switched on and preferably stabilized prior to turning the laser diode 4 on. Either solution has the advantage in stabilizing the laser radiation 8 (injection locking the laser diode 4) rapidly.

Figure 14:
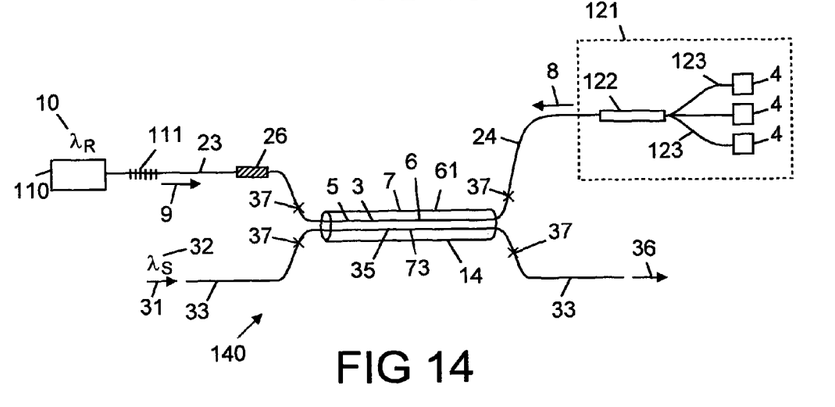
FIG. 14 shows laser apparatus including three pump sources and a semiconductor laser.

FIG. 14 shows laser apparatus in the form of an optical amplifier 140. The amplifying fibre 35 is a ytterbium-doped fibre. The peak absorption wavelength 132 is approximately 976 nm. The predetermined wavelength $\lambda_R$ 10 is preferably 976 nm in order to ensure maximum absorption of the laser radiation 8 by the ytterbium doping in the amplifying fibre 35.

The reference source is the semiconductor laser 110, which is a single mode laser that is wavelength stabilized by the reflector 111. The reflector 111 can be a fibre Bragg grating, having a peak reflectivity at the predetermined wavelength $\lambda_R$ 10, which in this example is 976 nm, a bandwidth in the range of approximately 0.1 nm to 5 nm, and a reflectivity in the range 2% to 20%. The semiconductor laser 110, being wavelength locked by the reflector 111, emits the reference radiation 9 at approximately 976 nm. Preferably, the semiconductor laser 110 is temperature stabilised with a thermoelectric cooler (often included within the package of the semiconductor laser 110). The semiconductor laser 110 preferably has its output power stabilised using a photodiode (often included within the package of the semiconductor laser 110) as a power monitor. The semiconductor laser 110 emits approximately 100 mW to 1 W of output power into the fibre 23. Typically, the fibre 23 is a single mode fibre, with a mode field diameter of approximately 6 μm, a numerical aperture of approximately 0.14, and a second-mode cut-off of approximately 900 nm. The fibre 23 may be a polarization maintaining fibre.

The fibre 23 is spliced to the reference fibre 3 which forms part of the composite fibre 61. The reference fibre 3 has a core 5 that guides the reference radiation 9 to the fibre 24. The core 5 preferably has a similar mode field diameter as the fibre 23 in order to minimize splice losses. By virtue of the core 5 within the reference fibre 3, the reference radiation 9 can be guided along the composite fibre 3 without being absorbed by the rare-earth dopant 73 within the amplifying fibre 35.

The laser diodes 4 are multi-mode pump diodes that each emit approximately 10 W of laser radiation 8 into the fibres 123. The fibre 123 has a silica core of 105 μm diameter, and a numerical aperture in the range 0.16 to 0.22. Preferably, the laser diodes 4 are temperature controlled.

The power combiner 122 is a three to one power combiner in which the power propagating along three multimode fibres 123 is combined into the fibre 24. The fibre 24 is preferably a multimode fibre with a silica or doped silica core and a numerical aperture of approximately 0.22.

Preferably, the multimode fibre 24 does not contain a single mode or few-moded core within its large silica core. Consequently, the reference radiation 9 coupled into the multimode fibre 24 from the reference fibre 3 propagates to each of the laser diodes 4 in approximately equal powers. With careful management of splice losses, it is possible to couple approximately 100 mW to 200 mW of the reference radiation 9 to each of the laser diodes 4, which is approximately 1% to 2% of the 10 W of the laser radiation 8 emitted by each. Such power is sufficient to injection lock the laser diodes 4 such that they emit the laser radiation 8 at the predetermined wavelength $\lambda_R$ 10 which can be set at the peak absorption wavelength 132 of the amplifying fibre 35.

The laser radiation 8 is coupled into the first cladding 6 of the reference fibre 3, whereupon it couples over to the amplifying fibre 35 and is absorbed by the ytterbium dopant. Any unabsorbed power from the laser radiation 8 can be removed by the cladding mode stripper 26 and/or by the polymer coating on the fibre 23, which coating preferably has a refractive index higher than the refractive index of silica. It should be noted that some of the laser radiation 8 will couple from the fibre 24 into the core 5 of the reference fibre 3. The proportion will be approximately equal to the ratio of the number of guided modes that can propagate in the core 5 to the number of modes that are propagating in the fibre 24. The proportion will be a small number and thus the likelihood of the laser diodes 4 damaging the laser 110 is very small.

The optical signal 31 coupled into the core 71 of the amplifying fibre 35 is amplified to produce the amplified output signal 36.

Preferably, for high peak power amplifiers (peak powers greater than approximately 100 W and preferably greater than 5 kW), such as pulsed lasers, the amplifier 140 is counter pumped as shown in FIG. 14. Counter pumping minimizes non-linear effects such as self phase modulation, and also reduces the risk that the signal 31, or the amplified signal 36 (eg from back reflections) that escapes from the core 5 in bends and kinks, damages one of the reference source 2 or the laser diodes 4. More preferably, the amplifying fibre 35 contains a pedestal 81 as shown with reference to FIG. 8 in order to reduce even further the likelihood of signal 31 or the amplified signal 36 from propagating towards the reference source 2 or the laser diodes 4 and damaging one of them.

Additional pump diodes 4 can be used for amplifiers having higher average powers. Multi-mode fibre power combiners 122 are available that have ratios of input fibres 123 to output fibres 24 (without cores) of 3:1, 7:1, 12:1 19:1 from suppliers such as OFS Specialty Photonics Division of Furukawa Electric North America Inc. of Somerset, N.J., USA. As the number or power of the laser diodes 4 increases, proportionally less of the reference radiation 9 will be injected into them. Increased power can be achieved by using polarization combining to combine the output powers from two semiconductor lasers 110, or with an optical amplifier.

The amplifier 140 shown in FIG. 14 thus solves the problem of poor wavelength control and repeatability of multimode laser pump diodes, namely poor wavelength repeatability from device to device±10 nm, strong temperature dependent wavelength (0.3 nm/K), and strong power-dependence on wavelength (1 nm/W).

Laser apparatus in the form of an optical amplifier has been described above with reference to FIG. 14 by way of example only. Equivalent arrangements can be designed using the laser apparatus shown in FIGS. 1 to 5.

The invention enables pumping of the rare earth dopant 73 at its peak absorption wavelength 132. This permits the amplified optical signal 36 to have high beam quality and high peak powers for optimum materials processing capability without necessitating the high optical intensities within the core during the amplification of high-power optical radiation. It permits shorter fibre lengths to be used to avoid undesirable optical non-linearities. It is particularly useful for reducing pulse distortion owing to self phase modulation and stimulated Brillouin scattering in pulsed fibre lasers having average powers of 10 W to 50 W and peak powers in excess of 5 kW. It is also useful for reducing non-linear effects such as stimulated Raman scattering in high-power single moded or few moded (V value less than 10, or beam quality $M^2$ in the range 2 to approximately 20) continuous-wave lasers having power levels in excess of 100 W, 400 W, 1 kW or more preferably, in excess of 4 kW.

Figure 15:
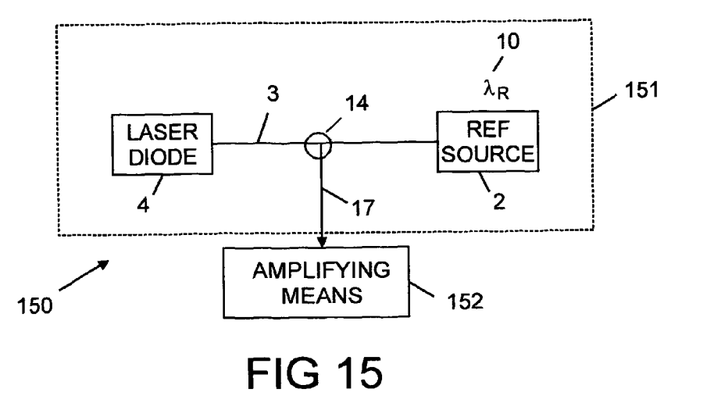
FIG. 15 shows laser apparatus comprising a wavelength stabilised source and an amplifying means.

Referring now to FIG. 15, there is shown laser apparatus 150. The laser apparatus 150 comprises a wavelength stabilised source 151 with a laser output 17. The laser output 17 can pump an amplifying means 152, which can be the amplifying fibre 35. Alternatively, the amplifying means 152 can be an amplifying rod, such as used in rod lasers, or an amplifying disk, such as used in disk lasers, an amplifier, a fibre laser, a rod laser, a disk laser, or a laser. The wavelength stabilised source 151 includes the reference source 2, the laser diode 4, and the separating means 14. The invention is particularly applicable for injecting multimode laser diodes. Examples of the wavelength stabilized source 151 are shown in FIGS. 1 to 6 and 14.

Some advantages of the invention are that the reference radiation 9 can be derived from single-mode emitters wavelength-locked with highly-stable fibre Bragg gratings, the reference radiation 9 can be arranged to be present when the laser diodes 4 are switched on, and low-cost reliable 'single-emitter' multi-mode pump diodes can be used. The invention thus provides a means to injection lock multimode laser diodes, rapidly, and simply, and to do this while providing a laser output 17 having high power (greater than 60% and more preferably greater than 90% or 95% of the power of the laser radiation 8) with a wide selection of injection locked wavelengths that are defined by the choice of the predetermined wavelength 10 of the reference source 2. Suitable predetermined wavelengths 10 include: the peak absorption wavelength of a rare-earth doped fibre laser, rod laser, or disk laser; a wavelength at which heat dissipation is reduced or preferably minimized in a fibre laser, rod laser, or disk laser; and a wavelength which optimizes efficiency within a fibre laser, rod laser. These features are consistent with achieving a fast modulation rate of wavelength-locked pump radiation necessary for rapid process control in fibre lasers, rod lasers and disk lasers. Moreover, it allows such fast modulation rates to be achieved with increased efficiencies and reduced amplifier fibre lengths, which combination leads to lower non-linear effects (such as self phase modulation) and/or higher peak powers being available from amplifier fibres.

It is to be appreciated that the embodiments of the invention described above with reference to the accompanying drawings have been given by way of example only and that modifications and additional components may be provided to enhance performance. The present invention extends to the above-mentioned features taken in isolation or in any combination.

The invention claimed is:

1. Laser apparatus comprising a reference source, a reference fibre, and at least one laser diode, wherein the reference fibre comprises a core having a refractive index $n_1$ and a first cladding having a refractive index $n_2$, the first cladding is surrounded by a second cladding having a refractive index $n_3$, the refractive index $n_1$ is greater than the refractive index $n_2$, the refractive index $n_2$ is greater than the refractive index $n_3$, the laser diode emits laser radiation that is guided through the first cladding of the reference fibre, the reference source emits reference radiation that has a predetermined wavelength, the reference radiation is guided through the core of the reference fibre to the laser diode, and the reference radiation that is guided through the core of the reference fibre to the laser diode has a power at the predetermined wavelength, which power is greater than an injection locking threshold of the laser diode thereby to injection lock the laser diode.

2. Laser apparatus according to claim 1 wherein the reference source is such that the product of its power at the predetermined wavelength and a first loss experienced by the reference radiation in propagating from the reference source to the laser diode is at least 0.5% of the power of the laser radiation emitted by the laser diode.

3. Laser apparatus according to claim 1 wherein a second loss experienced by the laser radiation in propagating from the laser diode to the reference source is such that the product of the second loss and the power of the laser radiation emitted by the laser diode is less than 10% of the power of the reference radiation emitted by the reference source.

4. Laser apparatus according to claim 1 and including a coupler for coupling the reference radiation from the core to the first cladding of the reference fibre.

5. Laser apparatus according to claim 4 wherein the coupler is a blazed fibre Bragg grating.

6. Laser apparatus according to claim 1 and including a wavelength division multiplexer.

7. Laser apparatus according to claim 1 and including an amplifying means.

8. Laser apparatus according to claim 7 wherein the amplifying means is an amplifying fibre.

9. Laser apparatus according to claim 8 wherein the reference fibre and the amplifying fibre are in optical contact along a portion of their length such that the laser radiation guided by the first cladding of the reference fibre can couple into and pump the amplifying fibre.

10. Laser apparatus according to claim 8 wherein the amplifying fibre comprises a pedestal.

11. Laser apparatus according to claim 8 wherein the amplifying fibre comprises at least one rare-earth dopant.

12. Laser apparatus according to claim 8 wherein the laser diode is arranged to counterpump the amplifying fibre.

13. Laser apparatus according to claim 1 wherein the reference fibre is a single mode fibre.

14. Laser apparatus according to claim 1 wherein the laser diode is a multimode laser diode.

15. Laser apparatus according to claim 1 and comprising a plurality of the laser diodes, wherein the laser diodes are combined by a combiner.

\* \* \* \* \*